United States Patent
Corzine

(10) Patent No.: US 7,679,098 B2
(45) Date of Patent: Mar. 16, 2010

(54) HIGHLY DIRECTIONAL LIGHT EMITTING DIODE USING PHOTONIC BANDGAP WAVEGUIDES

(75) Inventor: Scott W. Corzine, Sunnyvale, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 477 days.

(21) Appl. No.: 11/343,122

(22) Filed: Jan. 30, 2006

(65) Prior Publication Data

US 2007/0177644 A1 Aug. 2, 2007

(51) Int. Cl.
*H01L 27/15* (2006.01)
*H01L 29/22* (2006.01)

(52) U.S. Cl. .............. 257/99; 257/79; 257/103; 372/21; 372/44.01; 372/97

(58) Field of Classification Search ............ 257/79, 257/99, 103; 372/21, 44.01, 97
See application file for complete search history.

(56) References Cited

U.S. PATENT DOCUMENTS

| | | | | |
|---|---|---|---|---|
| 6,674,778 | B1 * | 1/2004 | Lin et al. ............... | 372/46.01 |
| 6,921,925 | B2 * | 7/2005 | Kish et al. .............. | 257/96 |
| 7,369,583 | B2 * | 5/2008 | Ledentsov et al. ........ | 372/20 |
| 2002/0030442 | A1 * | 3/2002 | Koyama et al. ........... | 313/504 |
| 2004/0076213 | A1 * | 4/2004 | Ledentsov et al. ........ | 372/97 |
| 2005/0035354 | A1 * | 2/2005 | Lin et al. ............... | 257/79 |
| 2005/0218422 | A1 * | 10/2005 | Tojo et al. ............. | 257/103 |

* cited by examiner

*Primary Examiner*—Kenneth A Parker
*Assistant Examiner*—Joseph Nguyen

(57) ABSTRACT

Edge-emitting light source and method for fabricating an edge-emitting light source. The edge-emitting light source includes a photonic crystal having at least one waveguide region. An edge-emitting semiconductor structure having a light emitting active layer is incorporated within the at least one waveguide region. Light emitted by the edge-emitting semiconductor structure and within the bandgap of the photonic crystal is confined within the waveguide region and guided out of the photonic crystal through the waveguide region.

20 Claims, 4 Drawing Sheets

HIGHLY DIRECTIONAL LIGHT EMITTING DIODE USING PHOTONIC BANDGAP WAVEGUIDES

DESCRIPTION OF RELATED ART

It is challenging to fabricate a light-emitting diode (LED) that is highly directional because it is difficult to control spontaneous light emissions that travel in all directions from the LED. Although dielectric filters and other mechanisms can reflect light at certain angles, these mechanisms are generally not effective in reflecting light over a large range of angles.

Edge-emitting LEDs are desirable in many applications because they provide a relatively high spectral density with a relatively wide spectral width of about 80-100 nm, and are available at reasonable cost. Edge-emitting LEDs, however, emit light in the shape of a relatively wide stripe, and are not suitable for applications that desire a small spot of light. For example, a spot size of about 1.3µ to about 1.55µ is desired in order to focus light into an optical fiber.

Although a laser is brighter than an LED and is capable of emitting a small spot of light, the light emitted by a laser is usually within a very narrow bandwidth, and is therefore not satisfactory in many applications.

SUMMARY OF THE INVENTION

In accordance with the invention, an edge-emitting light source and a method for fabricating an edge-emitting light source are provided. The edge-emitting light source includes a photonic crystal having at least one waveguide region. An edge-emitting semiconductor structure having a light emitting active layer is incorporated within the at least one waveguide region. Light emitted by the edge-emitting semiconductor structure and within the bandgap of the photonic crystal is confined within the waveguide region and guided out of the photonic crystal through the waveguide region.

BRIEF DESCRIPTION OF THE DRAWINGS

Furthermore, the invention provides embodiments and other features and advantages in addition to or in lieu of those discussed above. Many of these features and advantages are apparent from the description below with reference to the following drawings.

DETAILED DESCRIPTION OF THE EXEMPLARY EMBODIMENTS OF THE INVENTION

Exemplary embodiments in accordance with the invention provide a highly-directional edge-emitting light emitting diode (LED) light source, and a method for fabricating an edge-emitting LED light source.

Figure 1:
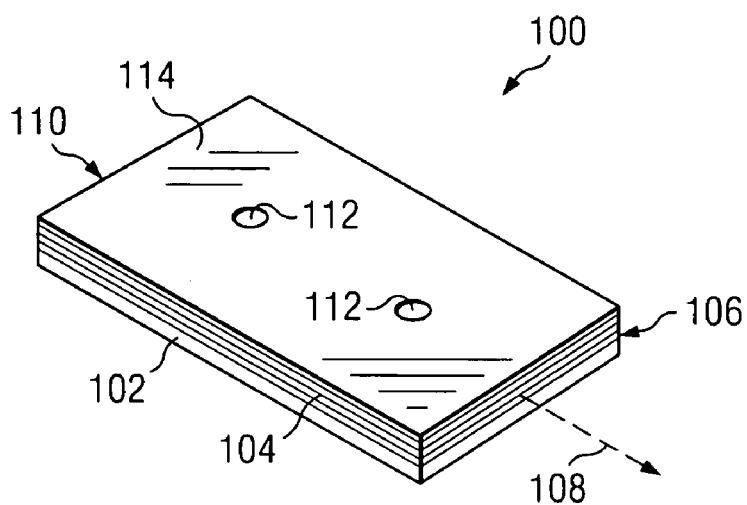
FIG. 1 is a schematic plan view of an edge-emitting LED that is known in the art to assist in explaining exemplary embodiments in accordance with the invention.

FIG. 1 is a schematic plan view of an edge-emitting LED that is known in the art to assist in explaining exemplary embodiments in accordance with the invention. The edge-emitting LED is generally designated by reference number 100, and comprises a GaN (Gallium Nitride)-based edge-emitting LED. GaN-based edge-emitting LEDs are preferable over conventional surface-emitting LEDs in many applications because they can provide a very bright blue or green light beam.

Edge-emitting LED 100 includes substrate 102, for example, an insulating sapphire ($Al_2O_3$) substrate, and GaN-based semiconductor layers including epitaxial layers 104 grown on the substrate. As is known to those skilled in the art, much of the light produced by LED 100 (~70 percent of the light) is trapped between substrate 102 and epitaxial layers 104, and is guided to the edges of the LED. Reflectors (not shown in FIG. 1) are usually provided on non-light emitting edge 110 of LED 100 to redirect light guided to edge 110 to light-emitting edge 106 such that a bright blue or green light beam 108 is emitted from light-emitting edge 106.

Two contacts, schematically illustrated at 112, are typically provided on top surface 114 of epitaxial layers 104 to provide electrical connection for the LED. (In edge-emitting LEDs employing a conducting substrate, the contacts are usually provided above and below the LED.)

GaN-based edge-emitting LED 100 emits a light beam in the form of a thin but very wide elongated stripe, for example, a beam that is about 500µ wide and about 4µ thick. As a result, edge-emitting LED 100 is essentially a line light source and is not suitable for use in applications that desire a light beam having a more two-dimensional cross-sectional shape, such as a light beam having a cross-sectional shape in the form of a small spot of light. Thus, although a GaN-based edge-emitting LED is a bright light source; its usefulness is severely restricted by the shape of the light beam it emits.

Photonic crystals are periodic dielectric structures that can prohibit the propagation of light in certain frequency ranges. In particular, photonic crystals have spatially periodic variations in refractive index, and with a sufficiently high refractive index contrast, photonic bangaps can be opened in the structure's optical spectrum within which propagation of light through the photonic crystal is prevented.

A three-dimensional photonic crystal can prevent the propagation of light having a frequency within the crystal's bandgap in all directions, however, fabrication of such a structure is often challenging. As a result, a desirable alternative may be to utilize a two-dimensional photonic crystal slab having a two-dimensional periodic lattice incorporated within it. In a two-dimensional photonic crystal slab, light propagating through the slab is confined in a direction perpendicular to a major surface of the slab by total internal reflection, while propagation in other directions is controlled by properties of the photonic crystal slab.

It is known that introducing a defect in the periodic structure of a photonic crystal allows the existence of localized electromagnetic states that are trapped at the defect site, and that have resonant frequencies within the bandgap of the photonic crystal. By providing a line of such defects extending through the photonic crystal, a waveguiding structure is created that can be used to control and guide light.

Figure 2:
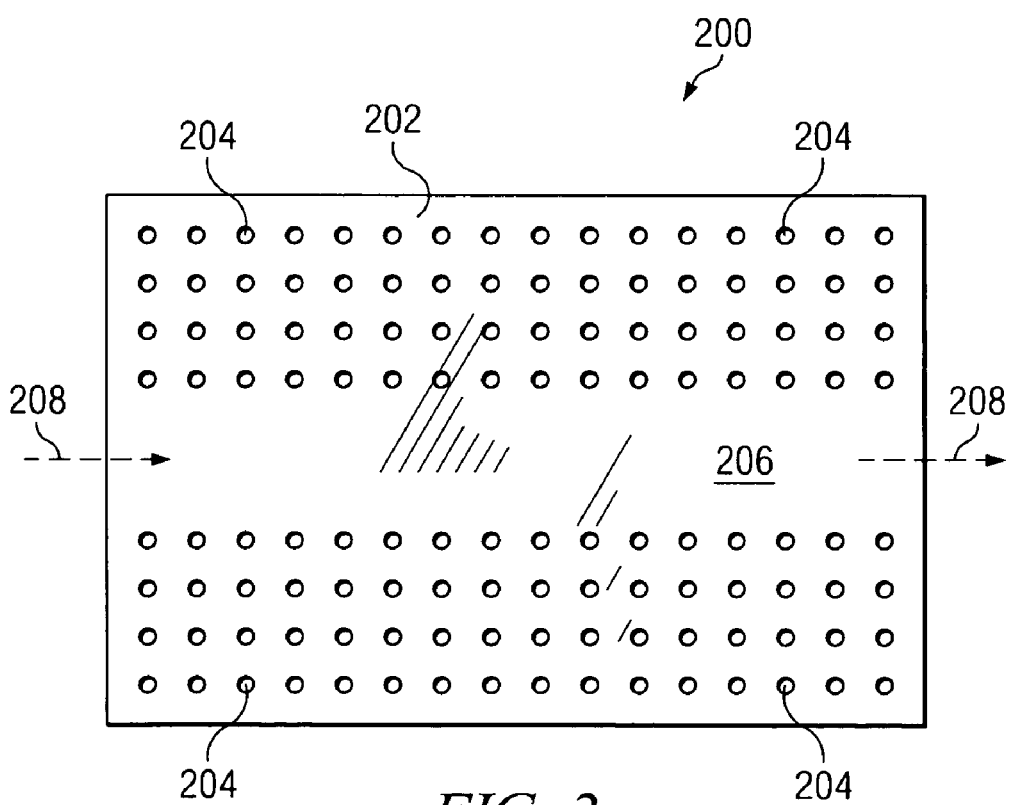
FIG. 2 is a schematic top view of a two-dimensional photonic crystal slab waveguide that is known in the art to assist in explaining exemplary embodiments in accordance with the invention.

FIG. 2 is a schematic top view of a two-dimensional photonic crystal slab waveguide that is known in the art to assist in explaining exemplary embodiments in accordance with the invention. The waveguide is generally designated by reference number 200, and comprises a slab body 202 having a two-dimensional periodic lattice incorporated within it. In the illustrated embodiment, the periodic lattice is composed of a two-dimensional array of cylindrical-shaped holes 204 filled with air or another material having a relatively low index of refraction, and the slab body is formed of a dielectric material having a relatively high index of refraction such as silicon.

Two-dimensional photonic crystal slab waveguide 200 also includes upper and lower cladding layers (not shown in FIG. 2) covering the upper and lower faces of photonic crystal slab 202 to confine light propagating in the structure in the direction perpendicular to the plane of FIG. 2 via total internal reflection.

A region of defects is provided in the array of holes to define a waveguide 206 that extends through the two-dimensional photonic crystal slab. Waveguide 206 is capable of transmitting light, indicated by arrows 208, having a frequency within the photonic bandgap of the surrounding photonic crystal material. The region of defects can be provided in various ways, for example by omitting one or more lines of holes or by altering one or more lines of the holes by making them larger, smaller or of a different shape than other holes in the periodic lattice.

Exemplary embodiments in accordance with the invention provide an edge-emitting light source in which an edge-emitting semiconductor structure having light emitting active layers is incorporated within at least one waveguide region of a two-dimensional photonic crystal slab waveguide to provide an edge-emitting light source that is highly directional and of a desired cross-sectional shape. More particularly, light emitted from the active layers of the edge-emitting semiconductor structure and propagating in the two-dimensional photonic crystal slab waveguide is confined in the direction perpendicular to a major surface of the slab body via total internal reflection, while photonic bandgap regions of the photonic crystal slab act as reflectors to light in the plane of the photonic crystal slab at all angles to confine the light within the waveguide if the emitted light is within the bandgap of the photonic crystal slab.

Figure 3:
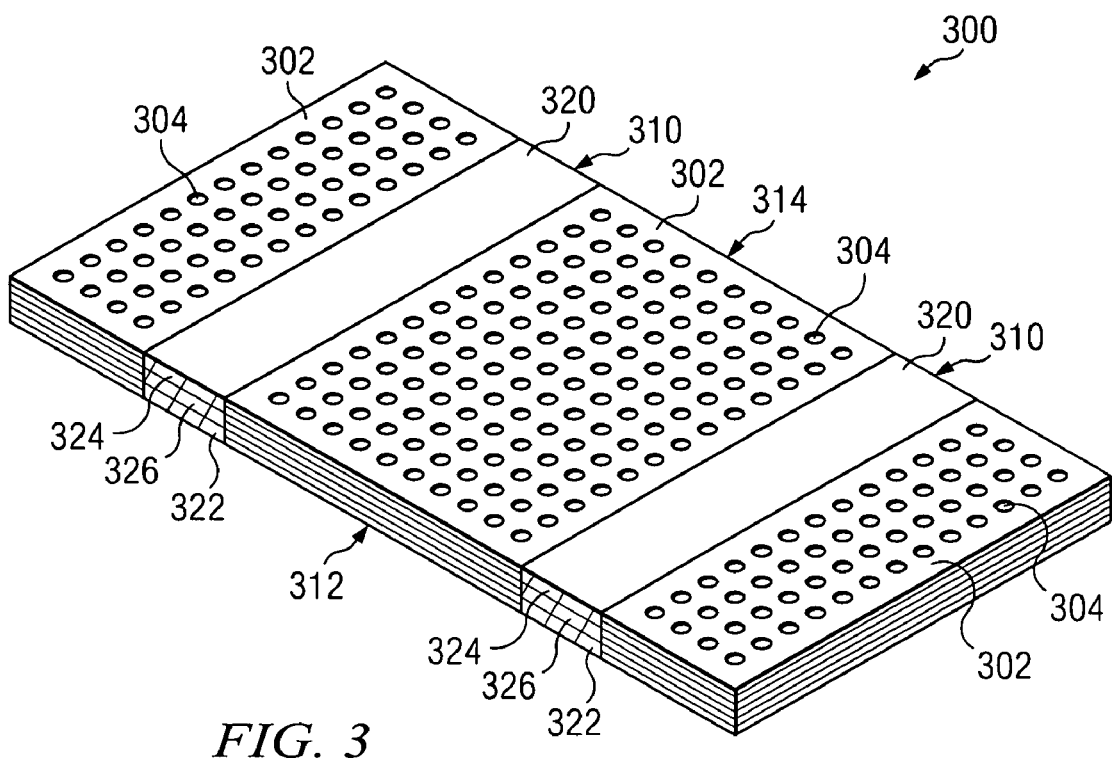
FIG. 3 is a schematic plan view of an edge-emitting LED light source according to an exemplary embodiment in accordance with the invention.

FIG. 3 is a schematic plan view of an edge-emitting LED light source according to an exemplary embodiment in accordance with the invention. The light source is generally designated by reference number 300, and comprises a two-dimensional photonic crystal that includes slab body 302 formed of a dielectric material having a relatively high index of refraction, for example, $S_iO_2$. A periodic lattice formed by an array of cylindrical-shaped holes 304 is incorporated in slab body 302. The holes are filled with a material having a relatively low index of refraction, for example, air. A plurality of waveguide regions 310 extends through slab body 302 from light input end 312 to light output end 314. In the exemplary embodiment in accordance with the invention illustrated in FIG. 3, waveguides 310 are formed by omitting rows of holes in slab body 302.

A semiconductor structure comprising edge-emitting LED 320 is provided in each waveguide 310. In the exemplary embodiment in accordance with the invention illustrated in FIG. 3, each LED 320 comprises n-type GaN layers 322, p-type GaN layers 324 and active layers 326 therebetween for emitting light. LEDs 320 extend along the length of waveguides 310 such that light exiting the waveguides will have dimensions corresponding to the cross-sectional shape of the waveguides. By proper design of the waveguides, a beam of light having a desired cross-sectional shape, for example, a small spot of light having dimensions of about 1μ by 1μ can be emitted from light source 300 and used as a light input to an optical fiber and in other applications.

It should be noted that although FIG. 3 illustrates an edge-emitting LED light source that includes two waveguides and two LEDs in a two-dimensional photonic crystal slab, this is intended to be exemplary only as a single photonic crystal slab may include one or more LEDs, and it is not intended to limit the invention to a photonic crystal waveguide having any particular number of LEDs.

Figure 4A:
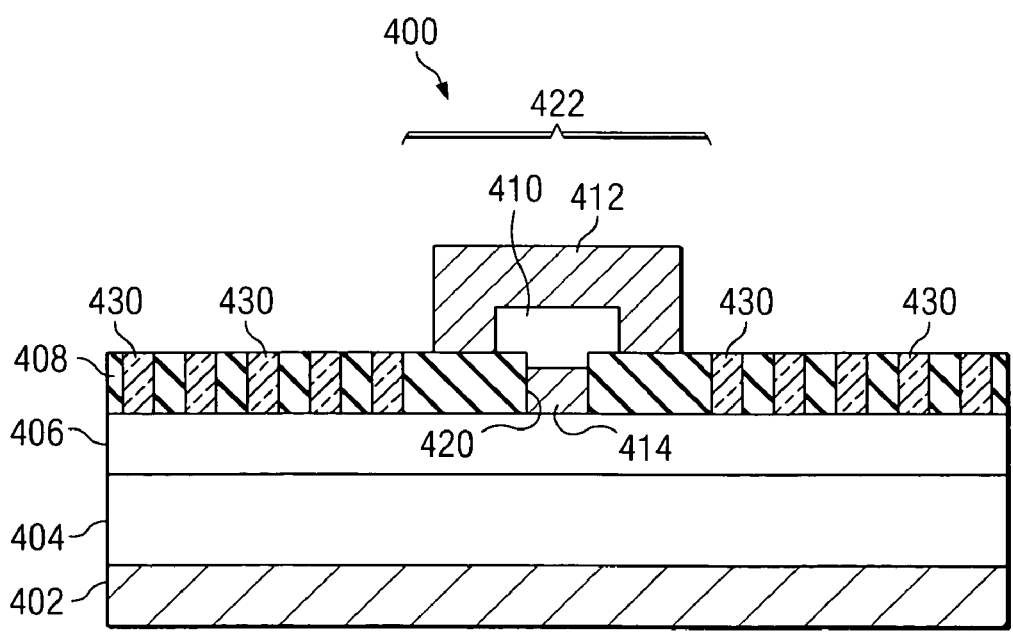
FIG. 4A is a schematic cross-sectional side view of an edge-emitting LED light source having a conducting substrate according to an exemplary embodiment in accordance with the invention.

FIG. 4A is a schematic cross-sectional side view of an edge-emitting LED light source having a conducting substrate according to an exemplary embodiment in accordance with the invention. The light source is generally designated by reference number 400, and comprises an ELOG (Epitaxial Lateral Over-Growth) confined Active semiconductor structure in an ELOG photonic crystal. The apparatus includes N-contact 402, conducting substrate 404, N layers 406, dielectric ELOG layer 408, P layers 410 and P-contact 412. Light-emitting active layers between N layers 406 and P layers 410 are shown at 414.

According to an exemplary embodiment in accordance with the invention, the semiconductor structure comprises a GaN-based semiconductor structure such as AlGaInN, N-contact 402 and P-contact 412 comprise metal alloys such as titanium-aluminum and nickel-gold (respectively) and conducting substrate 404 comprises SiC.

Edge-emitting LED light source 400 may be fabricated by first growing N layers 406 on substrate 404. ELOG dielectric layer 408 is then deposited on the surface of N layers 406. ELOG layer 408 is then patterned and etched to form a narrow stripe of, for example, from about 0.5-5 μm wide, that extends perpendicular to the plane of FIG. 4A, and that defines waveguide region 422 extending through the structure. Active and P layers 414 and 410 are then grown in stripe region 422. ELOG dielectric layer 408 is then patterned again to etch and form photonic crystal holes 430 in regions on either side of stripe waveguide region 422 (holes 430 could penetrate into semiconductor 406, if desired). Contact metals 402 and 412 are then deposited to complete the light source.

Figure 4B:
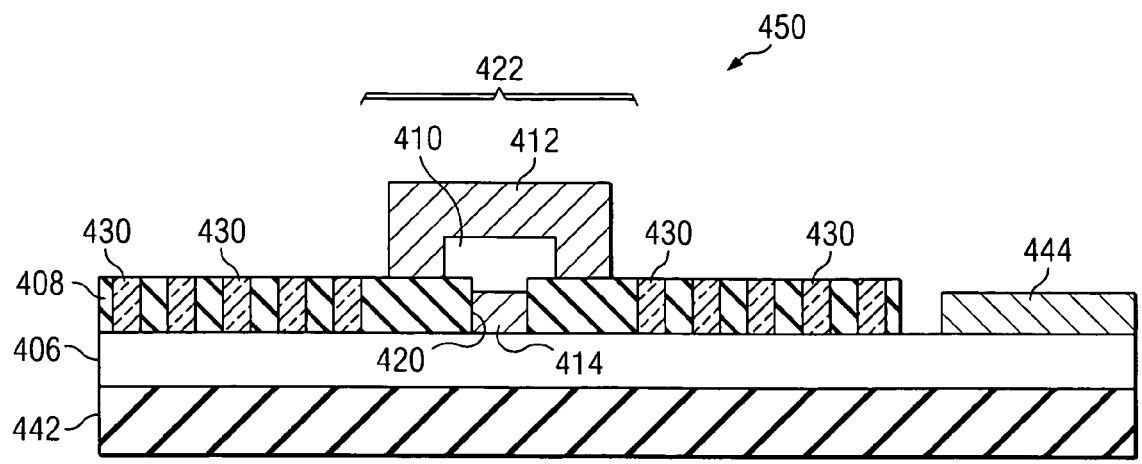
FIG. 4B is a schematic cross-sectional side view of an edge-emitting LED light source having an insulating substrate according to an exemplary embodiment in accordance with the invention.

FIG. 4B is a schematic cross-sectional side view of an edge-emitting LED light source having an insulating substrate according to an exemplary embodiment in accordance with the invention. The apparatus is generally designated by reference number 450, and is similar to light source 400 illustrated in FIG. 4A, and utilizes the same reference numbers for corresponding components. Light source 450 differs from light source 400 in that conducting substrate 404 in light source 400 is replaced by insulating substrate 442 formed, for example, of sapphire (Al$_2$O$_3$). In addition N-contact 402 in light source 400 is replaced by N-contact 444 applied to the top surface of N layers 406.

Figure 5A:
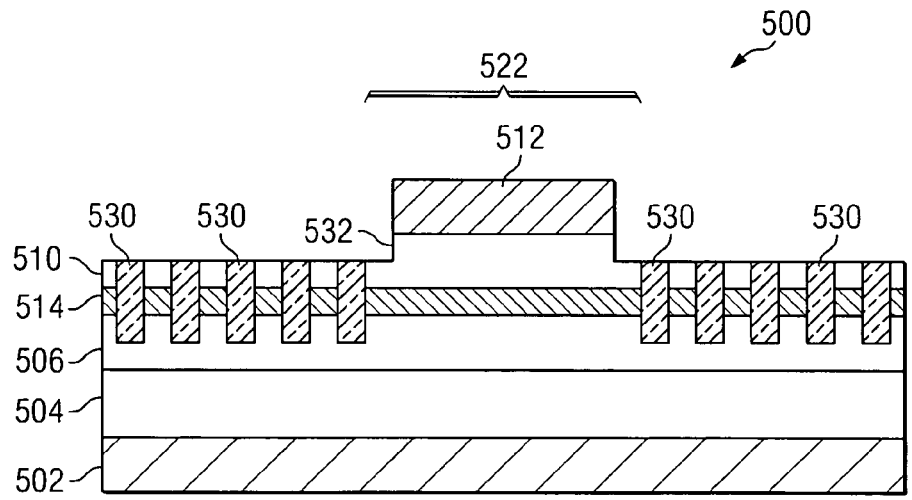
FIG. 5A is a schematic cross-sectional side view of an edge-emitting LED light source having a conducting substrate according to an exemplary embodiment in accordance with the invention.

FIG. 5A is a schematic cross-sectional side view of an edge-emitting LED light source having a conducting substrate according to an exemplary embodiment in accordance with the invention. The light source is generally designated by reference number 500, and comprises a metal/ridge confined active semiconductor structure with a semiconductor photonic crystal. Light source 500 includes N-contact 502, conducting substrate 504, N layers 506, light-emitting active layers 514, P layers 510 and P-contact 512. Holes 530 are etched through layers 514 and 510 and into N layers 506 to form a photonic crystal structure, and a stripe waveguide region 522 is defined in the semiconductor material.

Edge-emitting LED light source 500 may be fabricated by growing N layers 506, active layers 514 and P layers 510 on substrate 504. A stripe may be optionally patterned on the surface of P layers 510 and field etched to form a narrow 0.5-5 μm wide ridge 532 in at least a portion of P layers 510 and possibly active layers 514 for current confinement. The semiconductor material is then patterned and etched to form photonic crystal holes 530 on either side of stripe waveguide region 522. Contacts 502 and 512 are then deposited to complete the structure.

Figure 5B:
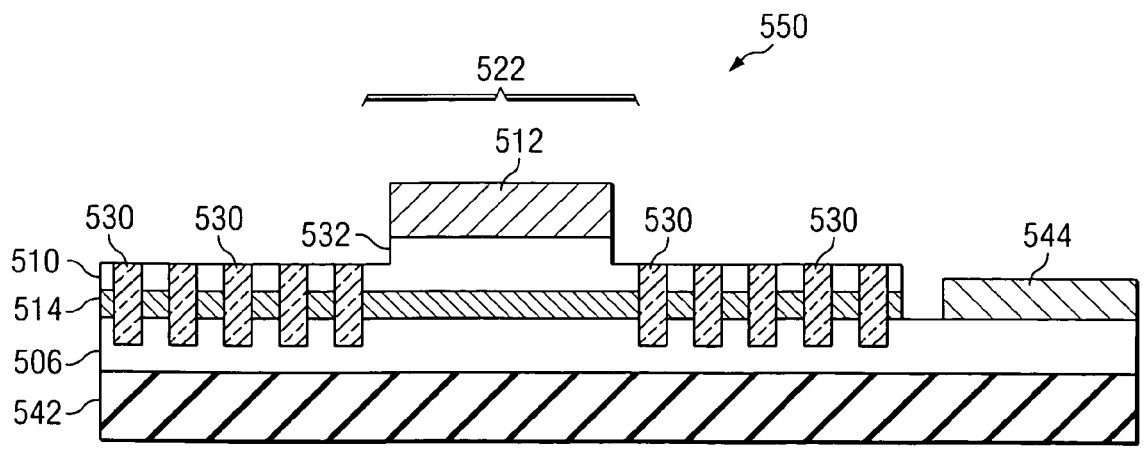
FIG. 5B is a schematic cross-sectional side view of an edge-emitting LED light source having an insulating substrate according to an exemplary embodiment in accordance with the invention.

FIG. 5B is a schematic cross-sectional side view of an edge-emitting LED light source having an insulating substrate according to an exemplary embodiment in accordance with the invention. The light source is generally designated by reference number 550, and is similar to light source 500 illustrated in FIG. 5A, and utilizes the same reference numbers for corresponding components. Light source 550 differs from light source 500 in that conducting substrate 504 in light source 500 is replaced by insulating substrate 542 formed, for example, of sapphire. In addition N-contact 502 in light source 500 is replaced by N-contact 544 applied to the top surface of N layers 506.

Figure 6A:
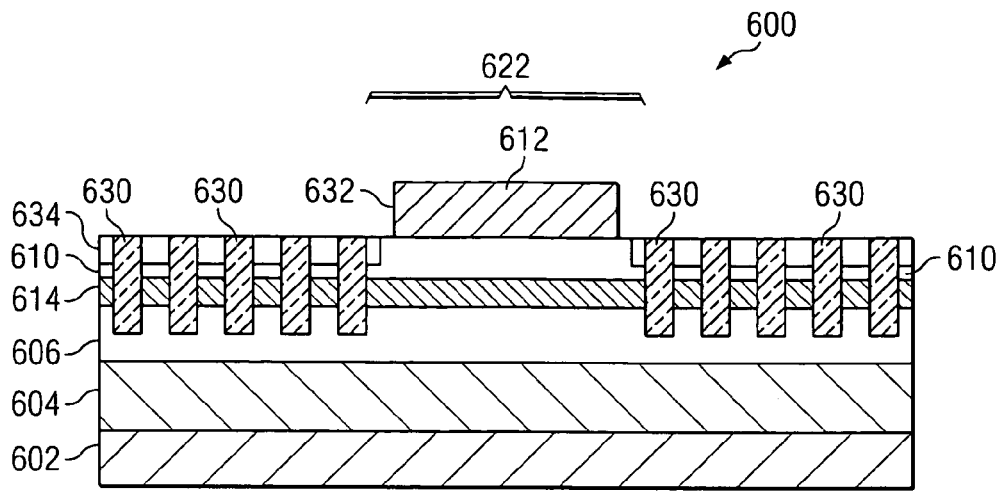
FIG. 6A is a schematic cross-sectional side view of an edge-emitting LED light source having a conducting substrate according to an exemplary embodiment in accordance with the invention.

FIG. 6A is a schematic cross-sectional side view of an edge-emitting LED light source having a conducting substrate according to an exemplary embodiment in accordance with the invention. The light source is generally designated by reference number 600, and comprises an implant confined active semiconductor structure in a semiconductor photonic crystal. Light source 600 includes N-contact 602, conducting substrate 604, N layers 606, light emitting active layers 614, P layers 610, implant isolation regions 634 and P-contact 612.

Light source 600 is fabricated by first growing N layers 606, active layers 614 and P layers 610 on substrate 604. A stripe protection layer is then patterned on the surface and field implanted, for example, with H or O, to form narrow 0.5-5 μm wide conducting stripe waveguide region 622 in a portion of P layers 610, and, possibly, active layers 614 for current confinement. The semiconductor is then patterned and etched to form photonic crystal holes 630 in regions on either side of stripe waveguide region 622. N and P-contacts 602 and 612 are then deposited to complete the light source.

Figure 6B:
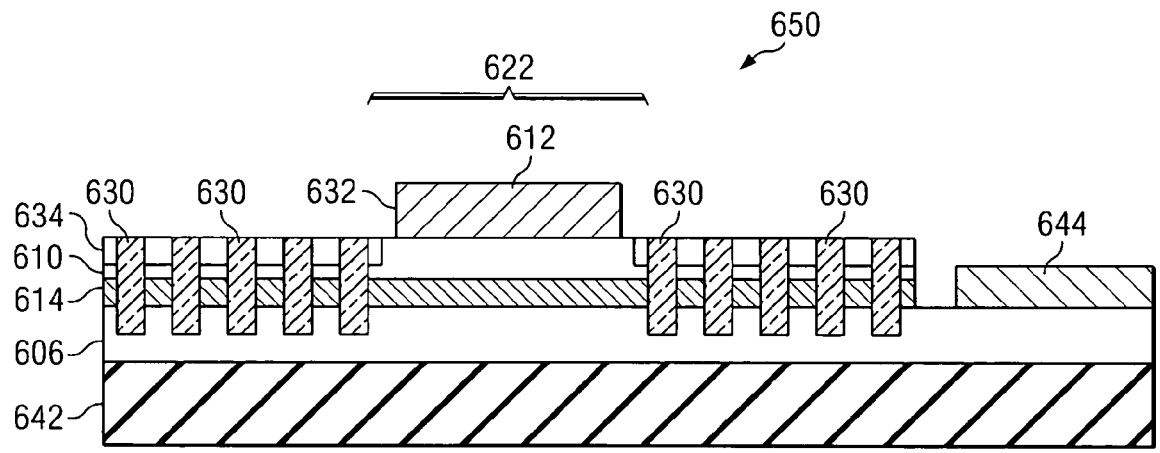
FIG. 6B is a schematic cross-sectional side view of an edge-emitting LED light source having an insulating substrate according to an exemplary embodiment in accordance with the invention.

FIG. 6B is a schematic cross-sectional side view of an edge-emitting LED light source having an insulating substrate according to an exemplary embodiment in accordance with the invention. The light source is generally designated by reference number 650, and is similar to light source 600 illustrated in FIG. 6A, and utilizes the same reference numbers for corresponding components. Light source 650 differs from light source 600 is that conducting substrate 604 in light source 600 is replaced by insulating substrate 642 formed, for example, of sapphire. In addition N-contact 602 in light source 600 is replaced by N-contact 644 applied to the top surface of N layers 606.

It should be understood that the embodiments in accordance with the invention illustrated in FIGS. 4-6 are intended to be exemplary only, and that edge-emitting LED light sources can also be constructed in other ways using different materials without departing from the scope of the invention. For example, although the described exemplary embodiments are GaN-based semiconductor structures, other semiconductor materials such as GaAs and InP can also be used if desired.

Edge-emitting LED light sources according to exemplary embodiments in accordance with the invention can have a stripe waveguide region length of from about 100 μm to about 2000 μm, and have a form factor much the same as standard edge-emitting semiconductor lasers. As indicated above, the cross-sectional shape of the stripe waveguide regions can be from about 0.5 μm to about 5 μm and be of square or rectangular shape to emit a beam of light having a similar cross-section.

Figure 7:
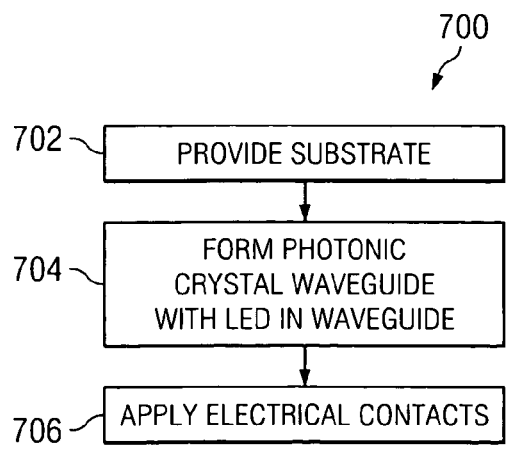
FIG. 7 is a flowchart that illustrates a method for fabricating an edge-emitting LED light source according to an exemplary embodiment in accordance with the invention.

FIG. 7 is a flowchart that illustrates a method for fabricating an edge-emitting LED light source according to an exemplary embodiment in accordance with the invention. The method is generally designated by reference number 700 and begins by providing a substrate (Step 702). The substrate can be a conducting substrate or an insulating substrate depending on the particular implementation. A photonic crystal waveguide incorporating an LED semiconductor structure in at least one waveguide region of the photonic crystal waveguide is then formed on the substrate (Step 704). As described previously, the semiconductor structure can be formed in various ways using various materials, and generally involves growing semiconductor materials to form N layers, P layers and light emitting active layers on the substrate, patterning a stripe waveguide region in the structure and patterning an array of photonic crystal holes in the structure. N and P-contacts are applied to complete the light source (Step 706).

While what has been described constitute exemplary embodiments in accordance with the invention, it should be recognized that the invention can be varied in numerous ways without departing from the scope thereof. Because exemplary embodiments in accordance with the invention can be varied in numerous ways, it should be understood that the invention should be limited only insofar as is required by the scope of the following claims.

I claim:

1. An edge-emitting light source, comprising:
   a photonic crystal having at least one waveguide region;
   an edge-emitting semiconductor structure having a light emitting active layer incorporated within the at least one waveguide region, wherein light emitted by the edge-emitting semiconductor structure and within a photonic bandgap of the photonic crystal is confined within the at least one waveguide region and guided out of the photonic crystal through the at least one waveguide region;
   wherein, the edge-emitting semiconductor structure comprises a plurality of layers spaced from one another in a first direction; and
   wherein the waveguide region restricts light emitted by the edge-emitting semiconductor structure from propagating in at least a second direction that is perpendicular to said first direction.

2. The edge-emitting light source according to claim 1, wherein the photonic crystal comprises a two-dimensional photonic crystal slab.

3. The edge-emitting light source according to claim 2, wherein the light guided out of the photonic crystal through the at least one waveguide region has a spot-shaped cross-section.

4. The edge-emitting light source according to claim 3, wherein the light guided out of the photonic crystal through the at least one waveguide region has cross-sectional dimensions of from about 0.5 .mu.m to about 5 .mu.m.

5. The edge-emitting light source according to claim 2, wherein the edge-emitting semiconductor structure comprises a GaN-based edge-emitting semiconductor structure.

6. The edge-emitting light source according to claim 2, wherein the edge-emitting semiconductor structure comprises a conducting substrate.

7. The edge-emitting light source according to claim 2, wherein the edge-emitting semiconductor structure comprises an insulating substrate.

8. The edge-emitting light source according to claim 2, wherein the edge-emitting semiconductor structure comprises an Epitaxial Lateral Over-Growth confined active semiconductor structure, and wherein the photonic crystal comprises an Epitaxial Lateral Over-Growth photonic crystal.

9. The edge-emitting light source according to claim 2, wherein the edge-emitting semiconductor structure comprises a metal/ridge confined active semiconductor structure, and wherein the photonic crystal comprises a semiconductor photonic crystal.

10. The edge-emitting light source according to claim 2, wherein the edge-emitting semiconductor structure comprises an implant confined active semiconductor structure, and wherein the photonic crystal comprises a semiconductor photonic crystal.

11. A method for fabricating an edge-emitting light source, comprising:
providing a substrate;
forming a photonic crystal waveguide on the substrate, the photonic crystal waveguide comprising a semiconductor structure formed in at least one waveguide region of the photonic crystal waveguide;
wherein, the semiconductor structure comprises a plurality of layers spaced from one another in a first direction; and
wherein the waveguide region restricts light emitted by the edge-emitting light source from propagating in at least a second direction that is perpendicular to said first direction.

12. The method according to claim 11, wherein forming a photonic crystal waveguide on the substrate, comprises forming a two-dimensional photonic crystal slab waveguide on the substrate.

13. The method according to claim 12, wherein providing a substrate comprises providing a conducting substrate, and wherein the method further includes:
applying an electrical contact to a surface of the conducting substrate and to a surface of the semiconductor structure.

14. The method according to claim 12, wherein providing a substrate comprises providing an insulating substrate, and wherein the method further includes:
applying a pair of electrical contacts to a surface of the semiconductor structure.

15. The method according to claim 12, wherein forming a photonic crystal waveguide on the substrate, comprises:
forming an Epitaxial Lateral Over-Growth confined active semiconductor structure, in an Epitaxial Lateral Over-Growth photonic crystal.

16. The method according to claim 12, wherein forming a photonic crystal waveguide on the substrate, comprises:
forming a metal/ridge confined active semiconductor structure in a semiconductor photonic crystal.

17. The method according to claim 12, wherein forming a photonic crystal waveguide on the substrate, comprises:
forming an implant confined active semiconductor structure in a semiconductor photonic crystal.

18. An edge-emitting light-emitting diode light source, comprising:
a two-dimensional photonic crystal slab having at least one waveguide region extending through the two-dimensional photonic crystal slab;
an edge-emitting semiconductor structure having a light emitting active layer incorporated within each at least one waveguide region, wherein light emitted by the edge-emitting semiconductor structure and within a photonic bandgap of the photonic crystal is confined within the at least one waveguide region and guided out of the photonic crystal through the at least one waveguide region;
wherein, the edge-emitting semiconductor structure comprises a plurality of layers spaced from one another in a first direction; and
wherein the waveguide region restricts light emitted by the edge-emitting semiconductor structure from propagating in at least a second direction that is perpendicular to said first direction.

19. The edge-emitting light-emitting diode light source according to claim 18, wherein the edge-emitting semiconductor structure comprises one of a conducting substrate and an insulating substrate.

20. The edge-emitting light-emitting diode light source according to claim 18, wherein the edge-emitting semiconductor structure comprises one of an Epitaxial Lateral Over-Growth confined active semiconductor structure, a metal/ridge confined active semiconductor structure, and an implant confined active semiconductor structure.

* * * * *

(12) EX PARTE REEXAMINATION CERTIFICATE (10331st)
United States Patent
Corzine

(10) Number: US 7,679,098 C1
(45) Certificate Issued: Oct. 15, 2014

(54) HIGHLY DIRECTIONAL LIGHT EMITTING DIODE USING PHOTONIC BANDGAP WAVEGUIDES

(75) Inventor: Scott W. Corzine, Sunnyvale, CA (US)

(73) Assignee: Avago Technologies General IP (Singapore) Pte. Ltd., Singapore (SG)

Reexamination Request:
No. 90/020,039, Nov. 19, 2013

Reexamination Certificate for:
Patent No.: 7,679,098
Issued: Mar. 16, 2010
Appl. No.: 11/343,122
Filed: Jan. 30, 2006

(51) Int. Cl.
*H01L 27/15* (2006.01)
*H01L 29/22* (2006.01)

(52) U.S. Cl.
USPC .................. 257/99; 257/79; 257/97; 257/103

(58) Field of Classification Search
None
See application file for complete search history.

(56) References Cited

To view the complete listing of prior art documents cited during the proceeding for Reexamination Control Number 90/020,039, please refer to the USPTO's public Patent Application Information Retrieval (PAIR) system under the Display References tab.

*Primary Examiner* — Leonardo Andujar

(57) ABSTRACT

Edge-emitting light source and method for fabricating an edge-emitting light source. The edge-emitting light source includes a photonic crystal having at least one waveguide region. An edge-emitting semiconductor structure having a light emitting active layer is incorporated within the at least one waveguide region. Light emitted by the edge-emitting semiconductor structure and within the bandgap of the photonic crystal is confined within the waveguide region and guided out of the photonic crystal through the waveguide region.

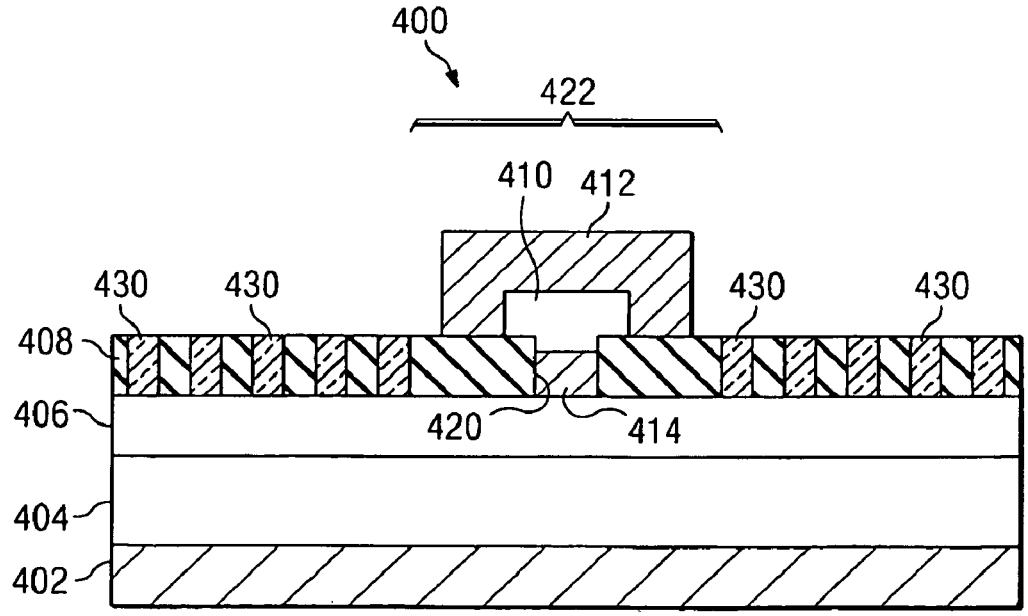

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-20 are cancelled.

\* \* \* \* \*